United States Patent [19]

Tadataka et al.

[11] 4,091,303
[45] May 23, 1978

[54] PIEZOELECTRIC QUARTZ VIBRATOR WITH HEATING ELECTRODE MEANS

[76] Inventors: Chiba Tadataka; Kurashige Masakazu, both of Kabushiki-Kaisha Kinsekisha-Kenkyujo, 23-17, Miyasaka 2-chome, Setagaya-ku, Tokyo, Japan

[21] Appl. No.: 716,408

[22] Filed: Aug. 23, 1976

[30] Foreign Application Priority Data

Aug. 21, 1975 Japan .............................. 50-101790
Oct. 8, 1975 Japan .............................. 50-121470
Oct. 15, 1975 Japan .............................. 50-124769
Oct. 23, 1975 Japan .............................. 50-127916

[51] Int. Cl.² .......................................... H01L 41/04
[52] U.S. Cl. ..................................... 310/343; 310/361
[58] Field of Search ................. 310/8.9, 9.1, 9.0, 361, 310/365, 366, 343; 319/210, 543, 501

[56] References Cited

U.S. PATENT DOCUMENTS

| 2,482,661 | 9/1949 | Dimmick | 310/8.9 X |
|---|---|---|---|
| 2,509,478 | 5/1950 | Caroselli | 310/8.9 |
| 3,171,048 | 2/1965 | Gerber | 310/8.9 |
| 3,201,621 | 8/1965 | Milner | 310/8.9 |
| 3,431,392 | 3/1969 | Garland et al. | 310/8.9 X |
| 3,818,254 | 6/1974 | Persson | 310/8.9 X |

Primary Examiner—Mark O. Budd
Attorney, Agent, or Firm—William Anthony Drucker

[57] ABSTRACT

Heating electrode means provided directly on a quartz vibrator body in a specific angular range does not effect on the change in the resonant frequency which is normally to be caused by direct heating of the body so that a highly stable piezoelectric quartz vibrator can be provided without a constant temperature box.

8 Claims, 25 Drawing Figures

PIEZOELECTRIC QUARTZ VIBRATOR WITH HEATING ELECTRODE MEANS

BACKGROUND OF THE INVENTION

This invention relates to piezoelectric quartz vibrators provided thereon with electrodes for heating the quartz plates so as to effect compensation in the change in vibration frequency caused by surrounding temperatures.

Piezoelectric quartz vibrators provided with heating electrodes uniformly around the exciting electrodes have heretofore been known. In FIG. 1, such a quartz vibrator having excitation electrodes 1 and 2 and heating electrodes 4 of an open ring form disposed on and along the periphery of the vibrator body is shown. Such heating electrodes are controlled in temperature by themselves or by means of other control elements so that the vibrator body can be heated for keeping a stable frequency-temperature characteristic of said vibrator body.

Actually however, in such a quartz vibrator of prior art, compensation in the change of the resonant frequency caused by an interior strain of the vibrator body cannot be effected by means of the means for controlling temperature. Such an interior strain of the vibrator body caused by heat produced by heating electrodes 4 caused a change in the resonant frequency of said vibrator body.

Therefore, a quartz vibrator having a high stability could not be afforded by means of the foregoing prior art if said quartz vibrator of the foregoing prior art could have merits of small power consumption and a short starting period before reaching a stationary state.

SUMMARY OF THE INVENTION

It is an object of this invention to provide piezoelectric quartz vibrators with heating electrodes in which temperature compensation in the resonant frequency can effectively be achieved.

It is another and important object of this invention to provide piezoelectric quartz vibrators having an excellent frequency-temperature characteristic, even if they are provided with a minimum number of electric parts in the circuits for controlling temperatures to be connected to the heating electrodes.

Other objects and merits of this invention will become apparent from the following description taken in connection with the accompanying drawings.

To achieve the foregoing objects, a piezoelectric quartz vibrator of this invention is characterized in that it has a quartz plate cut in parallel to the XZ'-plane of a quartz crystal, excitation electrodes and heating electrodes provided on said quartz plate, said heating electrodes being located at locations on said quartz plate apart from said heating electrodes, and said heating electrodes extending within an angular range of 80° as seen from the center of said heating electrodes and measured from the Z'-axis of said quartz crystal.

BRIEF DESCRIPTION OF THE DRAWINGS

FIG. 1b is a schematic diagrammatic side view of the quartz vibrator shown in FIG. 1a.

FIG. 4b is a schematic back view of the quartz vibrator shown in FIG. 4a.

DETAILED DESCRIPTION OF THE INVENTION

To enabling an easier comprehension of structures and functions of this invention, our fundamental experiments from which has been issued this invention will specifically be stated hereunder.

Figure 1A:
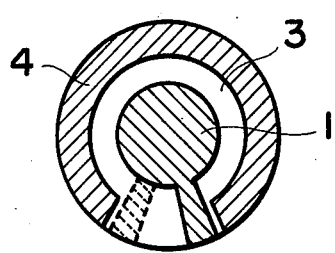
FIG. 1a is a schematic front view of a quartz vibrator with heating electrodes of prior art.
Figure 1B:
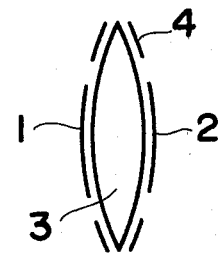
Figure 2:
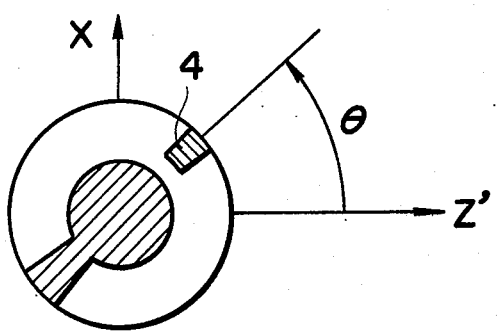
FIG. 2 is a schematic front view of a quartz vibrator with heating electrodes used in our fundamental experiments.

A quartz plate was provided thereon with a heating electrode 4 with small dimensions such as shown in FIG. 2 and said electrode 4 was supplied with a constant electric power of 60 milliwatts. The resonant frequencies of this quartz vibrator were measured in changing angle $\theta$ which is an angle measured from the Z'-axis of the quartz crystal to the center of heating electrode 4 under a constant surrounding temperature. It was confirmed that the resonant frequency changes according to values of angle $\theta$.

The quartz plate shown in FIG. 2 is a disc cut in parallel to the XZ'-plane which is a plane obtained by rotating the XZ-plane containing the X and Z axes of the quartz crystal about the X-axis. In the figures, Y' and Z' indicate respectively the Y'-axis and Z'-axis of the quartz crystal upon such a rotation of the axes. The angle of said rotation is predetermined by reference to the frequency-temperature characteristics of said quartz plate.

The frequency change fraction of the quartz vibrator caused exclusively by an interior strain due to thermal stress caused by the heating electrodes can be calculated by subtracting the frequency change fraction caused by the ordinary temperature change without said heating electrodes from the total frequency change in said vibrator with the heating electrodes. Said frequency change fraction caused by said ordinary temperature change can be obtained from the known frequency-temperature characteristic curves.

Figure 3A:
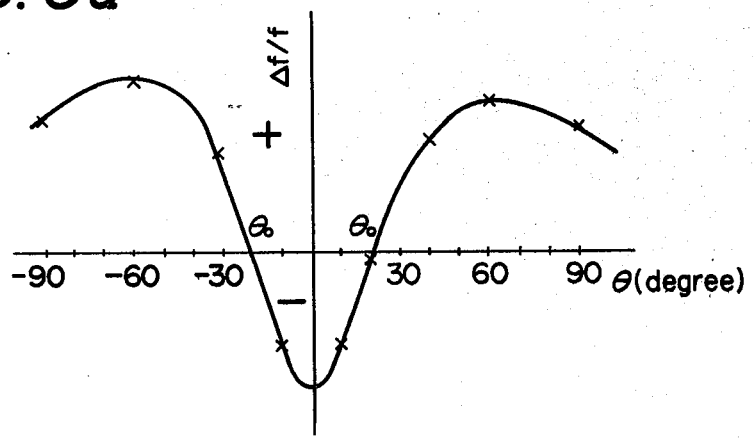
FIG. 3a is a graphical diagram shown in a relation between locations of the heating electrodes and the frequency change rates of a quartz vibrator such as shown in FIG. 2.
Figure 3B:
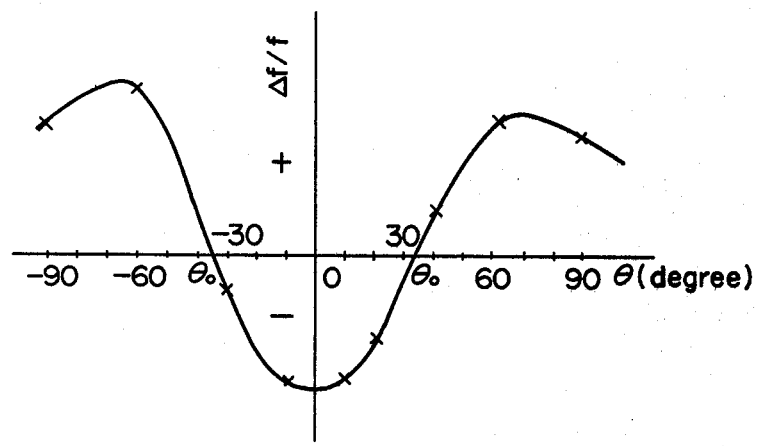
FIG. 3b is a graphical diagram similar to FIG. 3a shown in another quartz vibrator, but such as shown in FIG. 2.

In FIGS. 3a and 3b which are shown respectively in a characteristic curve of the frequency change rates $\Delta f/f$ of the resonant fequency of a quartz plate such as shown in FIG. 2 against angle $\theta$ of the heating electrode disposed on said quartz plate. Positive and negative signs of angle $\theta$ indicate respectively an anticlockwise and clockwise directions of $\theta$ measured from the Z'-axis. And, the frequency change fraction caused exclusively by said heating electrodes is given by the curves in FIGS. 3a and 3b, because these curves have been obtained by subtracting said ordinary frequency change fraction from said total frequency change.

The curves shown in FIGS. 3a and 3b have been obtained in our experiments using a lot of quartz vibrators such as shown in FIG. 2. And, the curves in FIGS. 3a and 3b represent the results in regard respectively to a quartz plate having a minimum values of $\theta$ and a quartz plate having a maximum values of $\theta$, which values of $\theta$ correspond to angular locations of the heating electrodes on a quartz plate, with which heating electrodes the value of the frequency change rate was zero. $\theta$ represents an angle $\theta$ at which $\Delta f/f$ is zero.

In FIGS. 3a and 3b, positive values of angle $\theta$ correspond to angles measured in the anticlockwise direction from Z'-axis in the first quadrant and angles measured in the clockwise direction in the second quadrant where Z'-axis and X-axis are taken for co-ordinate axes in FIG. 2. And, negative values of $\theta$ correspond to angles measured in the anticlockwise direction from Z'-axis in the third quadrant and angles measured in the clockwise direction from Z'-axis in the fourth quadrant.

As seen from FIG. 3a, the frequency change rate due to the foregoing interior strain is zero at an angle of $+20°$ or $-20°$ respectively. And, said frequency change rate is zero at an angle of $+35°$ or $-35°$ in FIG. 3b.

Also, it is to be noted in FIG. 3a and 3b, that the values of $\Delta f/f$ are negative within the range between $-20°$ and $+20°$, or $-35°$ and $+35°$ respectively. And, the values of $\Delta f/f$ are positive in the outside of said ranges in which the values of $\Delta f/f$ are negative.

Accordingly, it will be apparent that the change in the resonant frequency due to said interior strain of a quartz plate can be removed if heating electrode 4 are disposed so that said positive and negative values of $\Delta f/f$ are cancelled with each other.

The angular range of heating electrode 4 in which the change in the resonant frequency due to said interior strain of a quartz plate can be removed is $\pm 40°$ according to FIG. 3a and $\pm 70°$ according to FIG. 3b. If angle $\theta$ which is an angle $\theta$ in which $\Delta f/f$ is zero lies between $+20°$ and $+35°$ or between $-20°$ and $-35°$ respectively, said angular range of the heating electrode will be located between $+40°$ and $+70°$ or between $-40°$ and $-70°$ respectively. It is also seen from FIG. 3b that the frequency change can be cancelled if a heating electrode extends within an angular range which extends from an angular location of $+40°$ to another angular location of $-80°$, or from an angular location of $-40°$ to another angular location of $+80°$.

Consequently, it can be established that by means of a heating electrode which is disposed within an angular range of 80° in the anticlockwise and clockwise directions from the Z'-axis, the change in the resonant frequency due to direct heating of said quartz plate can substantially and effectively be removed.

In an embodiment of this invention shown in FIS. 4a and 4b, a quartz plate 5 is a disc cut in parallel to XZ'-plane of a quartz crystal. Excitation electrodes 6 and 7 formed by means of vacuum evaporation of gold, silver, alminium or other appropriate metals are provided in the central portions of quartz plate 5. Excitation electrodes 6 and 7 are connected electrically through leading electrodes 10 and 11 to feeding and supporting wires 8 and 9 respectively.

Auxiliary leading electrodes 10' and 11' are arranged at locations which face respectively leading electrodes 10 and 11 through the medium of quartz plate 5 so as to facilitate electric connection of leading electrodes 10 and 11 and wires 8 and 9. Electrodes 10 and 10', and 11 and 11' are connected respectively on the side face of quartz plate 5.

The heating electrodes are indicated at 12a and 12b. To forming such electrodes 12a and 12b, a film indicated at 12 of nickel-chrome alloy, copper-nickel alloy or other appropriate electrically resistive materials in a form of an open ring is formed on quartz plate 5. And, a portion indicated at 12c located on the X-axis of said film 12 is subsequently covered with an electrically conductive film 15. Said electrically conductive film is formed also by means of vacuum evaporation technique. The portion 12c of film 12 loses its resistive property due to conductive film formed thereon. Thus heating electrodes 12a and 12b are connected electrically with each other with conductive film 15. An end of electrode 12a is connected through a leading film element 13 to feeding wire 14. Also, an end of electrode 12b is connected through the foregoing electrode 10 to feeding wire 8.

Hereupon, values of angle $\phi$ of the foregoing angular ranges of the heating electrodes 12a and 12b which corresponds to the foregoing angle $\theta$ in the both anticlockwise and clockwise directions measured from Z'-axis have been changed from 80° to 140°, and change in the resonant frequency of the vibrator against change in the surrounding temeratures T °C where values of electric power with which heating electrodes 12a and 12b were supplied were taken for the parameter has been measured. FIG. 5b is shown in a curve connecting the lowest points of values of $\Delta f/f$ on the curves of $P_1$ and $P_2$ against temperatures where $\phi$ has been kept constant and the foregoing power supplied has been changed from $P_1$ to $P_2$.

Figure 5A:
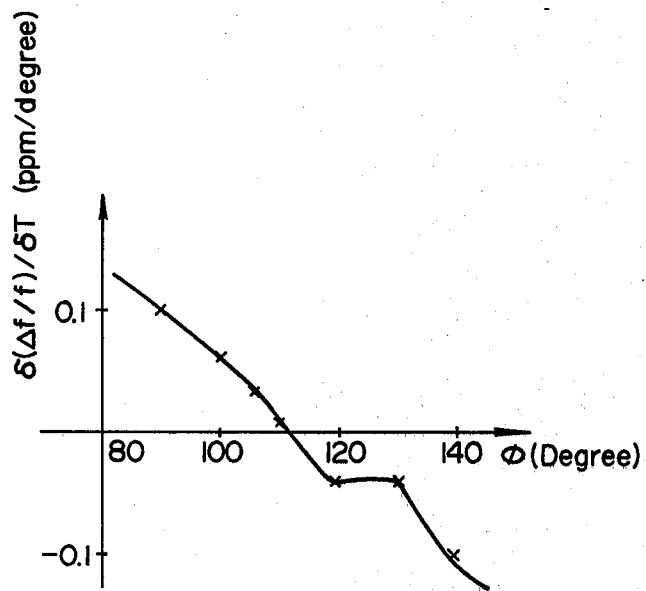
FIG. 5a is a graphical diagram shown in a relation between values of angle of the angular range of a heating electrode on the quartz plate as shown in FIGS. 4a and 4b and values of the change rate of the resonant frequency where values of the electric power supplied have been taken for the parameter.
Figure 5B:
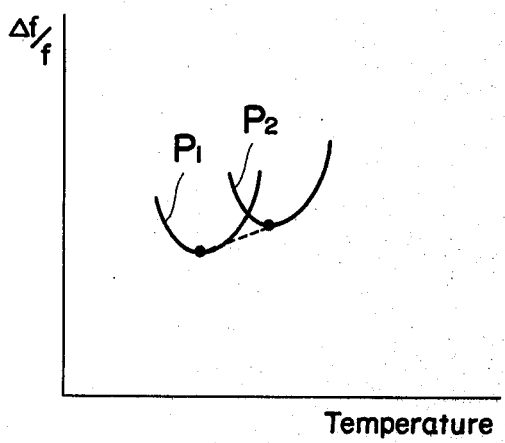
FIG. 5b is a graphical diagram shown in the change rates of the resonant frequency against temperatures where the angular value of the heating electrodes is fixed constant and the value of the electric power supplied is taken for the parameter.

It is seen from FIG. 5a which is shown in temperature coefficients of frequency change rate against values of angle of the foregoing angle $\phi$, that the value of temperature coefficient of frequency change rate $\delta(\Delta f/f)/\delta T$ is only 0.13 ppm/degree when said angle $\phi$ lies between 80° and 140°, and said temperature coefficient of frequency change rate shows a value of zero particularly when said angle φ lies between 112° and 113°. This shows that the effect of the interior strain of the quartz plate due to thermal stress on the resonant frequency is cancelled effectively.

Hereupon, the objects of this invention will be achieved if the heating electrode means are composed of only one element or plural numbers of such elements, subject to that each heating electrode is arranged within a range of 80° measured from the Z'-axis so that the change is the resonant frequency due to the foregoing interior strain is substantially cancelled as stated in the foregoing.

Figure 4A:
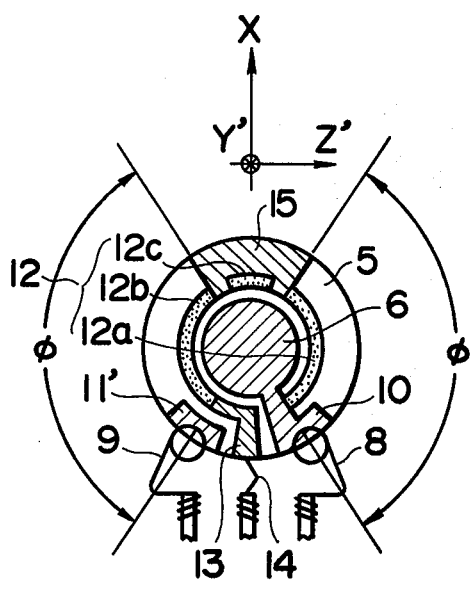
FIG. 4a is a schematic front view of an embodiment of this invention.
Figure 4B:
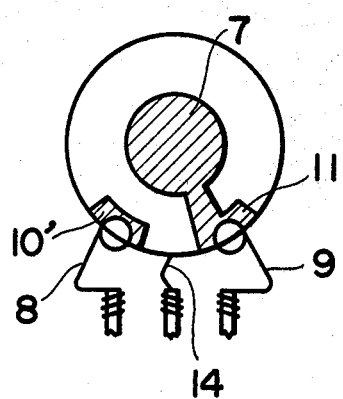
Figure 6A:
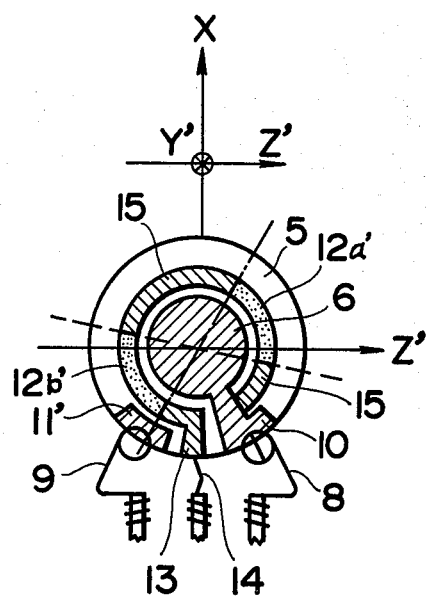
FIG. 6a is a front view of another embodiment of thin invention.
Figure 6B:
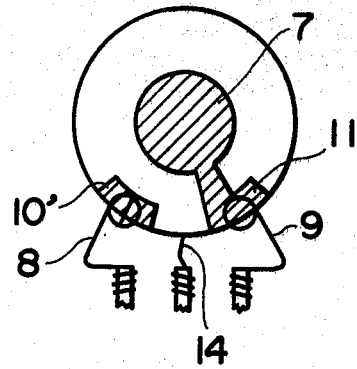
FIG. 6b is a back view of the embodiment shown in FIG. 6a of this invention.

The change in the resonant frequency due to the foregoing interior strain is cancelled effectively particularly when the heating electrodes are disposed axially symmetrically to each other to the Y'-axis. Such an arrangement of the heating electrodes are shown in FIGS. 6a and 6b in which the heating electrodes 12a' and 12b' are disposed at locations within angular ranges of from −10° to +60°. In FIGS. 6a and 6b, other numerals represent respectively a similar portion or part such as shown in FIGS. 4a and 4b.

Figure 7:
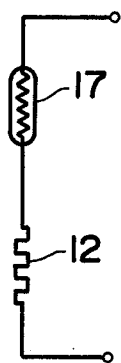
FIGS. 7, 9, and 10 are respectively a circuit diagram of a temperature compensation circuit to be applied to a quartz vibrator with heating electrodes according to this invention.

Hereunder will be stated features of temperature compensation circuits to be applied to a quartz vibrator according to this invention. In a temperature compensation circuit such as shown in FIG. 7, a positive characteristic temperature sensitive resistor element 17 such as a posistor is connected in series to the foregoing heating electrode or heating electrodes. The electric current I flowing through the heating electrodes changes in manner such as shown by curve "a" in FIG. 8, because such an element 17 has a characteristic in which the value of resistance is increased according to rise in the surrounding temperatures T. That is, fall in the surrounding temperature causes an increase in the radiant heat of the quartz plate, and on the other hand, the value of resistance of element 17 is decreased for causing an increase in the electric current flowing through the heating electrodes. And, on the contrary, rise in the surrounding temperature causes a decrease in the radiant heat and an increase in the value of resistance of the element 17 for causing a decrease in the electric current flowing through said heating electrodes.

Figure 8:
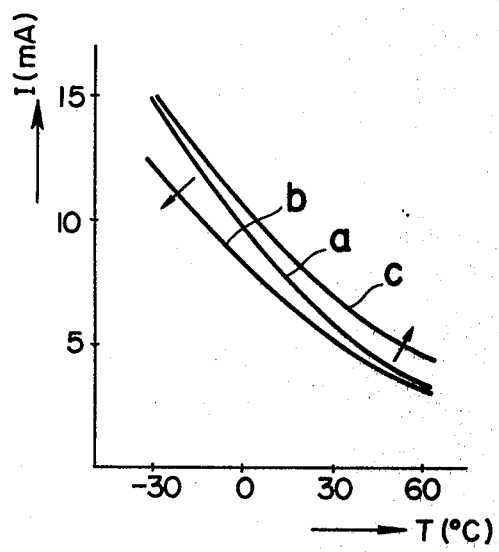
FIG. 8 is a graphical diagram shown in characteristics in temperature control by means of the circuits shown in FIGS. 7, 9, and 10.

To keeping a perfect balance of heat produced by the electric current with which the heating electrodes are supplied and given to the quartz plate and the radiant heat of said quartz plate, the vibrator must be designed through the selection of a most appropriate current-temperature characteristic curve in considering the foregoing radiant heat which corresponds to the size of the quartz plate and the heating electrodes. This is, the curve "a" as shown in FIG. 8 must occasionally be modified in the design.

Figure 9:
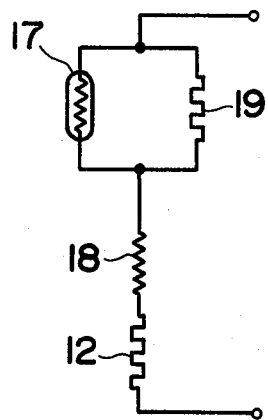
Figure 10:
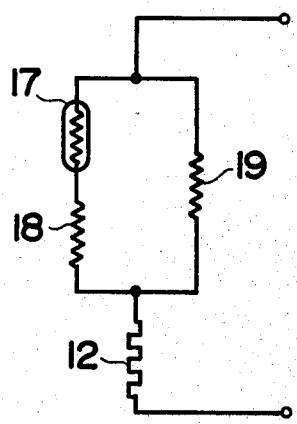

FIGS. 9 and 10 are shown in examples for such temperature compensation circuits with which a most appropriate current-temperature characteristic is to be obtained. The circuit shown in FIG. 9 has a parallel circuit of a posistor 17 and a resistor 19 which parallel circuit is connected in series to resistor 18, and the circuit shown in FIG. 10 has a series circuit of a posistor 17 and a resistor 18 which series circuit is connected in parallel to resistor 19.

By means of a circuit as shown in FIG. 9 or FIG. 10, inclination of the characteristic curve is decreased particularly at lower temperatures such as shown by curve "b" when the value of resistor 18 is increased, and such inclination of the characteristic curve is decreased particularly at higher temperatures such as shown by curve "c" when the value of resistor 18 is decreased.

It would be obvious from the foregoing that a most appropriate current-temperature characteristic curve can be obtained so as to effect a favourable temperature compensation of a quartz vibrator by means of adjusting resistors 18 and 19.

Figure 11:
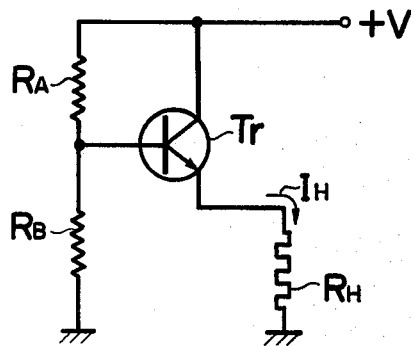
FIGS. 11, 12, and 13 are circuit diagrams respectively of another circuit or other circuits for the temperature compensation to be applied to a quartz vibrator with heating electrodes according to this invention.

FIG. 11 is shown in another example for the temperature compensation circuit to be applied to a quartz vibrator according to this invention. By using such a transistor circuit, electric current $I_H$ for producing a heat quantity which will correspond to a quantity of the foregoing radiant heat which will be changed in accordance with the surrounding temperatures can be applied to the foregoing heating electrodes indicated at $R_H$. In such a temperature compensation circuit, the foregoing radiant heat and the produced heat can be balanced more perfectly by means of applying for resistor circuits $R_A$ and $R_B$ resistor circuits as stated below and effecting adjustment of said resistor circuits $R_A$ and $R_B$.

Figure 12:
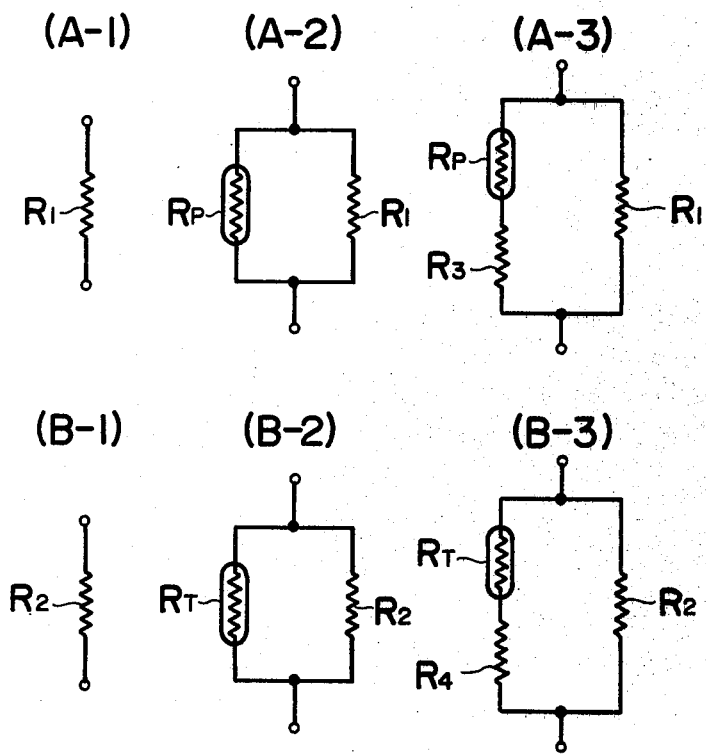

For such circuits to be connected for circuit $R_A$, resistor circuits shown in FIG. 12 and marked (A-1), (A-2) and (A-3) may be exemplified. And, for the circuits to be connected for circuit $R_B$, resistor circuits marked (B-1), (B-2) and (B-3) in FIG. 12 may be exemplified. In FIG. 12, $R_1$, $R_2$, $R_3$, or $R_4$ indicates respectively a fixed resistor or a variable resistor, and $R_P$ and $R_T$ indicate respectively a positive characteristic thermosensitive resistor element and a negative characteristic thermosensitive resistor element. It is desirable that at least one of the circuits $R_A$ and $R_B$ will contain a positive or negative characteristic thermosensitive resistor element.

Figure 13:
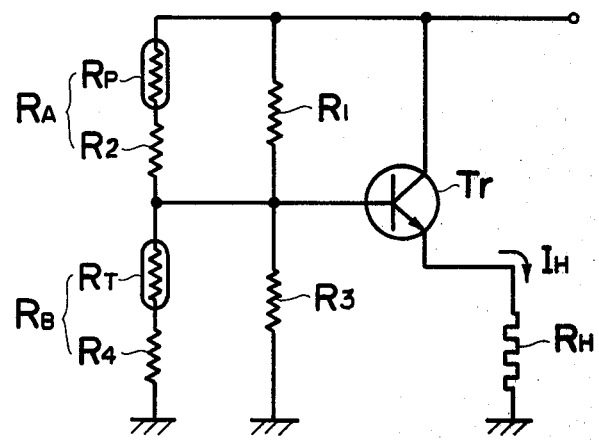

An embodiment of the foregoing temperature compensation circuit such as shown generally in FIG. 11 is shown in FIG. 13. In this circuit, the value of resistance each of $R_T$ and $R_P$ is 8 kilohms at 20° C, the voltage of the electric source is 10 volts, and the value of resistance of the heating electrodes is 500 ohms.

Figure 14:
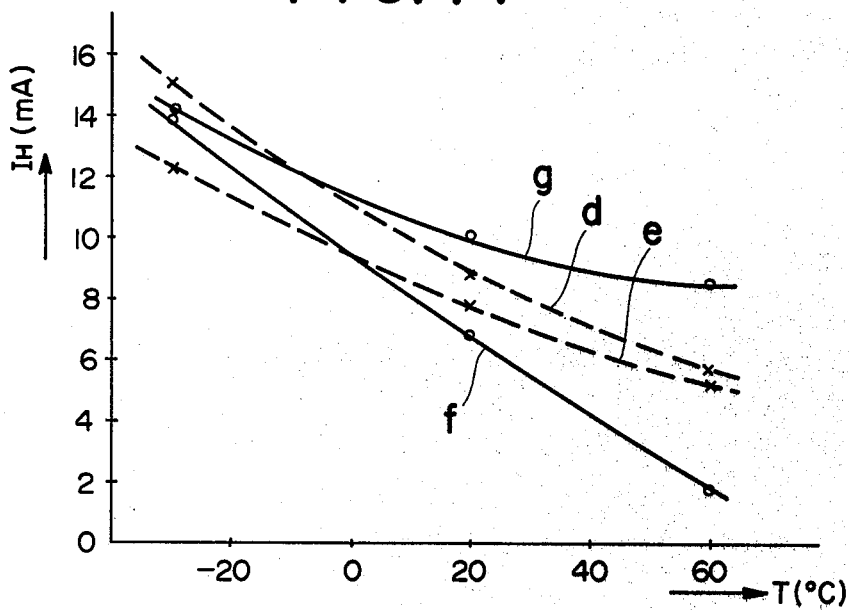
FIGS. 14, 15, and 16 are respectively a graphical diagram shown in characteristics in temperature control by means respectively of the circuits shown in FIGS. 11, 12, and 13.

(i) And, in the circuit shown in FIG. 13, the value of $R_1$ is 10 kilohms when circuit $R_A$ is opened, and the values of $R_3$ and $R_4$ are chosen as follows:

(d) $R_3 = 110$ kilohms, $R_4 = 4$ kilohms
(e) $R_3 = 30$ kilohms, $R_4 = 4$ kilohms
(f) $R_3 = 60$ kilohms, $R_4 =$ short circuited
(g) $R_3 = 60$ kilohms, $R_4 = 10$ kilohms the relations of the surrounding temperatures T and the heating electrode current $I_H$ is shown in FIG. 14 by curves d, e, f, and g which correspond respectively to the choices of values of the resistors (d), (e), (f), and (g).

As seen from the curves shown in FIG. 14, it will be apparent that the current in the lower temperatures and the current in the higher temperatures are adjusted principally respectively by resistor $R_3$ and resistor $R_4$.

Figure 15:
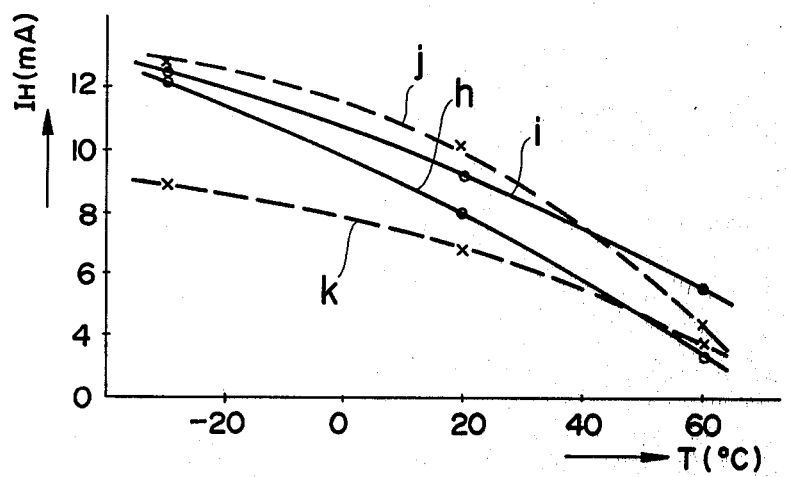

(ii) The value of $R_3$ is 10 kilohms when circuit $R_B$ is opened, and the values of $R_1$ and $R_2$ are chosen as follows:

(h) $R_1 = 110$ kilohms, $R_2 = 4$ kilohms
(i) $R_1 = 30$ kilohms, $R_2 = 4$ kilohms
(j) $R_1 = 60$ kilohms, $R_2 =$ short circuited
(k) $R_1 = 60$ kilohms, $R_2 = 10$ kilohms the relations of the surrounding temperatures and the heating electrode current are shown in FIG. 15 by curves h, i, j, and k which correspond respectively to the foregoing choices of values of the resistors (h), (i), (j), and (k). It should be noted that the current in the higher temperatures and the current in the lower temperatures are adjusted principally respectively by $R_1$ and $R_2$.

Figure 16:
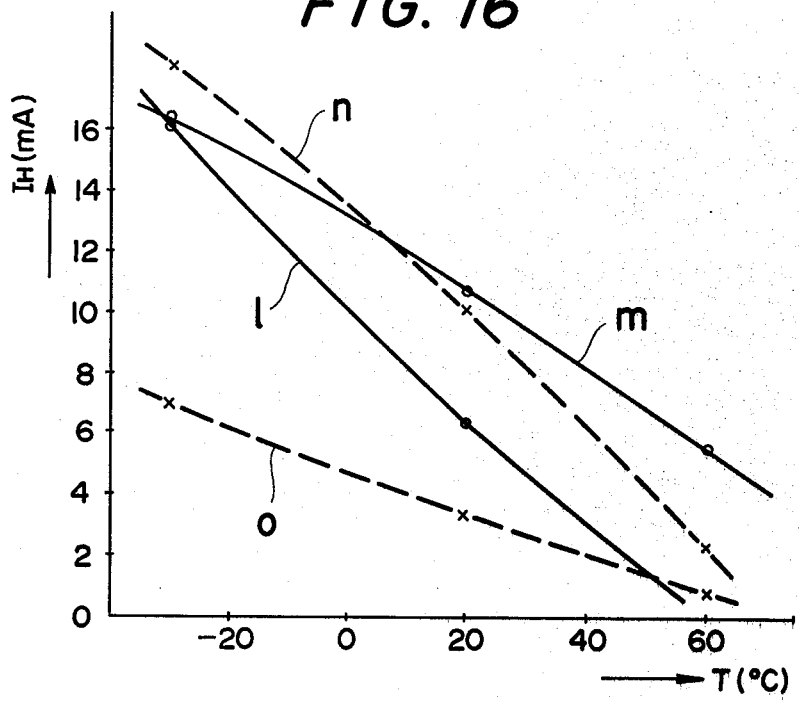

(iii) And, when the elements $R_P$ and $R_T$ having the foregoing values of resistance are present as shown and the values of $R_1$, $R_2$, $R_3$, and $R_4$ are chosen as follows:

(l) $R_1=110$, $R_2=4$, $R_3=60$, $R_4=$ short circuited
(m) $R_1=30$, $R_2=4$, $R_3=60$, $R_4=10$
(n) $R_1=60$, $R_2=$ short circuited, $R_3=110$, $R_4=4$
(o) $R_1=60$, $R_2=10$, $R_3=30$, $R_4=4$ where; numerical values are indicated in kilohms, the relation of the surrounding temperature and the heating electrode current are shown in FIG. 16. Similar to the foregoing cases (i) and (ii), the curves $l$, $m$, $n$, and $o$ correspond respectively to the foregoing choices of values of the resistors $(l)$, $(m)$, $(n)$, and $(o)$. As shown in FIG. 16, an adjustment in large scale of the heating electrode current can be achieved in this case as compared with the foregoing cases (i) and (ii).

It would be apparent from our experiments as stated above, that the current-temperature characteristics in the higher and lower temperatures can appropriately be altered respectively independently by means of adjusting the values of resistances contained in the temperature compensation circuits which are to be connected to the heating electrodes as disclosed in the foregoing. And, due to such alteration of said current-temperature characteristics in the higher and lower temperatures, a quartz vibrator according to this invention can be supplied with a heat quantity which corresponds to a quantity of radiant heat of the quartz plate so as to achieve a favourable temperature compensation. Consequent upon this, a quartz vibrator according to this invention can be provided with as high a stability as a known quartz vibrator sealed in a constant temperature box.

The explanation hereabove of the temperature compensation circuits is based upon the circuit shown in FIG. 11. However, the heating electrodes $R_H$ can also be connected to between the collector of transistor $Tr$ and the electric source indicated at +V in FIG. 11. Transistors in multi-stage connection in place of transistor $Tr$ in FIG. 11 can also be used so as to obtain a most appropriate current-temperature characteristics. When an even-stage connection of transistors is used, it is to be noted that the negative characteristic thermosensitive resistor element should be connected to between a transistor base and the electric source, and the positive characteristic thermosensitive resistor element be connected to between the transistor base and the ground. Further, transistor $Tr$ in FIG. 11 may be replaced by a field effect transistor in which, the base, the emitter and the collector of said transistor $Tr$ are to be replaced respectively by the gate, the source and the drain.

In the next place, it has been expected through our experiments, the results of which are shown in FIG. 5, that the frequency-temperature characteristic curves are to translate merely along the temperature coordinate according to values of the electric power applied to the heating electrodes. And, such expectation was confirmed by our experiments, the results of which are shown in FIG. 17.

Figure 17:
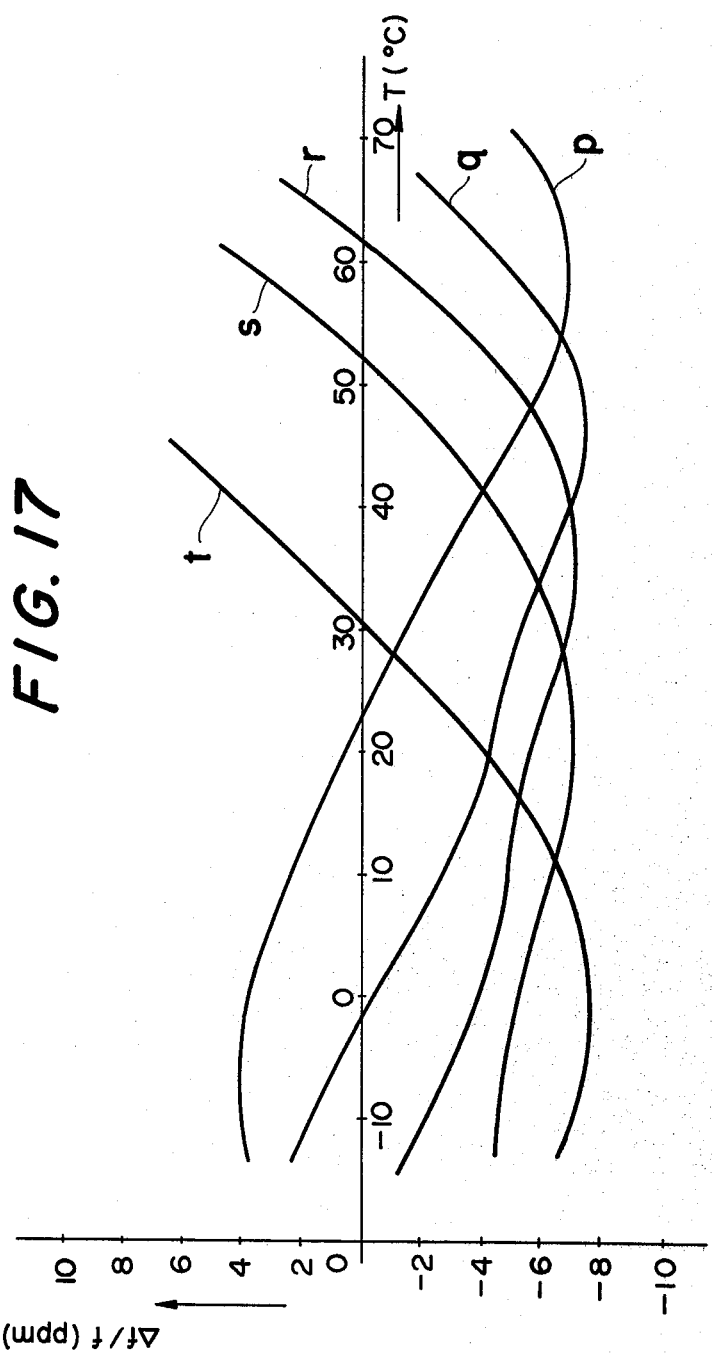
FIG. 17 is a graphical diagram shown in the modes of translation of a frequency-temperature characteristic curve according to values of electric power supplied to the heating electrodes of a quartz vibrator such as shown in FIG. 4.

In FIG. 17 are shown curves $p$, $q$, $r$, $s$, and $t$. These curves correspond to the frequency change rates in ppm against the surrounding temperatures in degrees at power supply of 0, 30, 45, and 60 milliwatts respectively with a quartz vibrator shown in FIG. 4 and when angle $\phi$ and the resonant frequency are 110° and 10 megahertz respectively.

Figure 18:
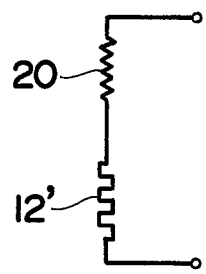
FIGS. 18, 19, and 20 are respectively a circuit diagram of a circuit for supplying the heating electrodes with a constant electric power.
Figure 19:
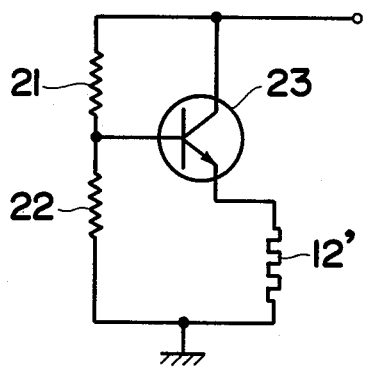
Figure 20:
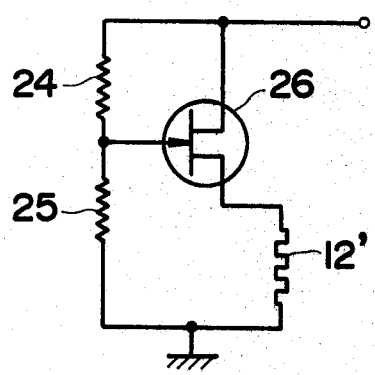

In FIGS. 18, 19, and 20 are shown examples of circuits for the supply of a constant electric power to the heating electrodes. The heating electrodes 12' of a quartz vibrator are supplied with a desired quantity of electric current by means of a fixed or variable resistor 20 in the circuit shown in FIG. 18, fixed bias resistors 21 and 22 in combination with the electrical characteristic of transistor 23 in the circuit shown in FIG. 19, and fixed bias resistors 24 and 25 in combination with the electrical characteristic of a field effect transistor 26.

Thus, according to this invention, a merit of direct heating-type temperature compensation in which a small power consumption and a short start for the stationary state due to direct heat transmission from heating elements are the specific features, together with a merit of side heating-type temperature compensation in which no change in resonant frequency due to interior strain of the quartz plate caused by heat are the specific features, can well be provided.

Consequently, according to this invention, quartz vibrators having as high a stability as those sealed in constant temperature boxes can be afforded without using any such bulky containers. Moreover, it could be an important merit that the manufacturing costs of quartz vibrators can be minimized because the parts and elements used in a temperature compensation circuit to be applied to a quartz vibrator of this invention are small in number. And further, it would also be a merit of this invention that a quartz vibrator with a tolerable temperature compensation can be provided by using merely a circuit for the supply of a constant electric power in place of the foregoing temperature compensation circuits.

We claim:

1. A piezoelectric quartz vibrator which commprises an orbicular quartz plate cut in parallel to XZ'-plane of a quartz crystal, excitation electrode means of a substantially round form provided on and along the central areas of the major faces of the quartz plate, and heating electrode means to maintain the quartz plate at a desired temperature, a said heating electrode means being in a form of a circular arc provided on and along said major face and concentrically to and apart from said excitation electrode means, and a said heating electrode means extending exclusively within an angular range of ±80° as measured from the Z'-axis including the center of said excitation electrode means of the quartz crystal, where a counterclockwise direction in the first quadrant or a clockwise direction in the second quadrant is indicated at the positive sign, and a counterclockwise direction in the third quadrant and a clockwise direction in the fourth quadrant is indicated at the negative sign, in which quadrants are taken said center of said excitation electrode means for the origin, said Z'-axis for the abscissa and the X-axis of the quartz crystal for the ordinate; whereby change in the resonant frequency of the quartz plate due to the inner strain thereof caused by the heating the quartz plate by means of said heating electrode means is minimized.

2. A piezoelectric quartz vibrator as claimed in cliam 1, wherein said angle of said angular range is +40°.

3. A piezoelectric quartz vibrator as claimed in claim 1, wherein said angle of said angular range is ±70°.

4. A piezoelectric quartz vibrator as claimed in claim 3, wherein a said heating electrode means extends from an angular location located within an angular range of an angle of ±40° to another angular location located between respective angular locations of angles of ±40° and ±70°.

5. A piezoelectric quartz vibrator as claimed in claim 1, wherein a said heating electrode means extends within an angular range extending from an angular location on an angle of 40° in an angular direction to another angular location of an angle of 80° in another angular direction, said angular range being located in one side of the X-axis of said quartz crystal and measured from Z'-axis of said quartz crystal.

6. A piezoelectric quartz vibrator as claimed in claim 1, wherein said heating electrode means are located in a pair at symmetrical locations with regard to the Y'-axis of said quartz crystal.

7. A piezoelectric quartz vibrator as claimed in claim 1, wherein said heating electrode means are connected to a temperature compensation circuit having at least one thermosensitive resistor element.

8. A piezoelectric quartz vibrator as claimed in claim 1, wherein said heating electrode means are connected to a temperature compensation circuit having at least one resistor and one active element.

* * * * *